(12) United States Patent
Yin et al.

(10) Patent No.: US 12,388,462 B2
(45) Date of Patent: Aug. 12, 2025

(54) MONOTONIC HYBRID CAPACITOR DIGITAL-TO-ANALOG CONVERTER

(71) Applicant: Taiwan Semiconductor Manufacturing Company, Ltd., Hsinchu (TW)

(72) Inventors: Aidong Yin, Hsinchu (TW); Shenggao Li, Hsinchu (TW); Paul Ranucci, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 212 days.

(21) Appl. No.: 18/348,422

(22) Filed: Jul. 7, 2023

(65) Prior Publication Data

US 2024/0313800 A1 Sep. 19, 2024

Related U.S. Application Data

(60) Provisional application No. 63/490,135, filed on Mar. 14, 2023.

(51) Int. Cl.
  *H03M 1/80* (2006.01)
  *H03K 19/20* (2006.01)
(52) U.S. Cl.
  CPC ............ *H03M 1/802* (2013.01); *H03K 19/20* (2013.01)
(58) Field of Classification Search
  CPC ........ H03M 1/80; H03M 1/802; H03M 1/661; H03K 19/20; H03K 7/081
  See application file for complete search history.

(56) References Cited

U.S. PATENT DOCUMENTS

| | | | | |
|---|---|---|---|---|
| 5,144,525 A | * | 9/1992 | Saxe | ............... G11C 27/024 365/45 |
| 5,367,302 A | * | 11/1994 | Kalthoff | ............... H03M 1/804 341/166 |

(Continued)

FOREIGN PATENT DOCUMENTS

| | | |
|---|---|---|
| EP | 0483945 B2 | 8/1996 |
| TW | 201246800 A | 11/2012 |
| TW | 1489788 B | 6/2015 |

OTHER PUBLICATIONS

Korean Office Action; Application No. 10-2024-0030619; Dated Dec. 12, 2024.

(Continued)

*Primary Examiner* — Lam T Mai
(74) *Attorney, Agent, or Firm* — Jones Day

(57) ABSTRACT

A monotonic capacitor digital-to-analog converter (CDAC) is provided. The CDAC includes a converter array comprising a plurality of CDAC units, wherein each CDAC unit comprises a logic unit, a switch, and a capacitor, and wherein each logic unit comprises a first input, a second input, and a third input. The CDAC further includes a first set of control lines, and each of the first set of control lines is connected to the first inputs of the logic units of the CDAC units in a corresponding column of the converter array. The CDAC further includes a second set of control lines, and each of the second set of control lines is connected to the second inputs of the logic units of the CDAC units in a corresponding row of the converter array, but is disconnected from the second input of the logic unit of a CDAC unit in the corresponding row and the last column of the converter array. Each of the second set of control lines is further connected to the third inputs of the logic units of the CDAC units in a row of the converter array adjacent to the corresponding row.

20 Claims, 12 Drawing Sheets

(56) References Cited

U.S. PATENT DOCUMENTS

| | | | | |
|---|---|---|---|---|
| 5,581,252 | A * | 12/1996 | Thomas | H03M 1/466 341/172 |
| 6,486,816 | B2 * | 11/2002 | Seymour | H03M 1/804 341/172 |
| 7,944,379 | B2 * | 5/2011 | Ohnhaeuser | H03M 1/0612 341/172 |
| 9,444,486 | B2 * | 9/2016 | Kuttner | H03M 1/66 |
| 9,973,202 | B2 * | 5/2018 | Yoshioka | H03M 1/0854 |
| 10,218,376 | B1 * | 2/2019 | Collins | H03M 1/0641 |
| 10,601,437 | B1 * | 3/2020 | Kuttner | H04B 1/04 |
| 10,812,098 | B1 * | 10/2020 | Vishweshwara | H03M 1/466 |
| 10,868,558 | B1 * | 12/2020 | Tripurari | H03M 1/462 |
| 11,233,524 | B1 * | 1/2022 | Bult | H03M 1/468 |
| 11,521,051 | B2 | 12/2022 | Chang et al. | |
| 11,831,328 | B2 * | 11/2023 | Liu | H03M 1/462 |
| 2008/0048935 | A1 * | 2/2008 | Yoshioka | G09G 3/3696 345/55 |
| 2011/0260899 | A1 * | 10/2011 | Snedeker | H03M 1/1047 341/118 |
| 2011/0304493 | A1 * | 12/2011 | Mitikiri | H03M 1/462 341/150 |
| 2014/0328429 | A1 * | 11/2014 | Kuttner | H03M 1/66 375/295 |
| 2019/0207615 | A1 * | 7/2019 | Mitikiri | H03M 1/0881 |
| 2020/0258564 | A1 * | 8/2020 | Mazzucchelli | G11C 11/4074 |
| 2021/0119638 | A1 * | 4/2021 | Ghosh | H03M 1/164 |
| 2021/0203349 | A1 * | 7/2021 | Chung | H03M 1/468 |
| 2022/0012580 | A1 * | 1/2022 | Srivastava | G11C 11/412 |

OTHER PUBLICATIONS

Taiwan Office Action; Application No. 112133400; Dated May 27, 2024.

Korean Notice of Allowance; Application No. 10-2024-0030619; Dated Jun. 23, 2025.

\* cited by examiner

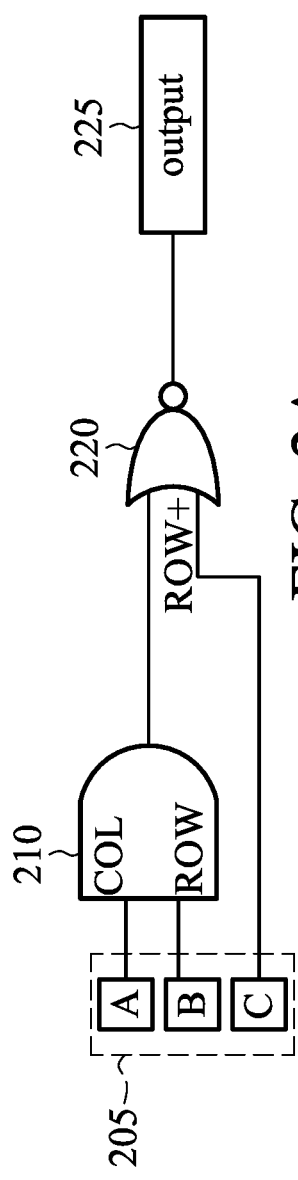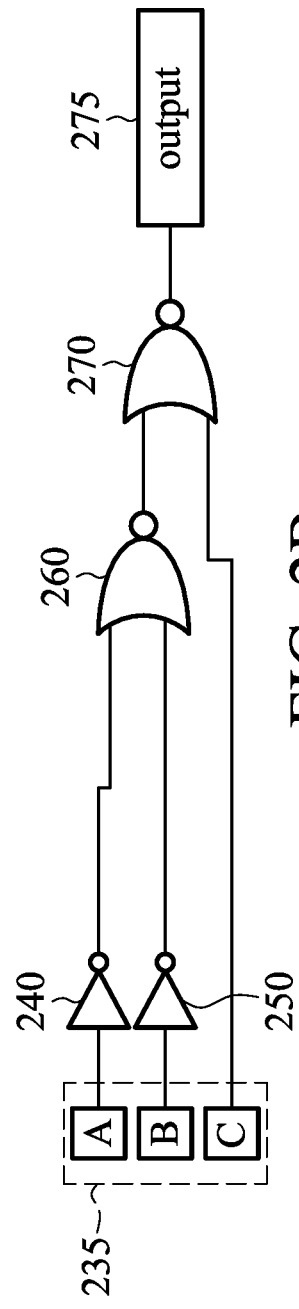
FIG. 2A  FIG. 2B  FIG. 2C

| FT<24:1> | CAP in |
|---|---|
| 000000000000000000000000 | 0 |
| 000000000000000000000001 | 1 |
| 000000000000000000000011 | 2 |
| 000000000000000000000111 | 3 |
| 000000000000000000001111 | 4 |
| 000000000000000000011111 | 5 |
| 000000000000000000111111 | 6 |
| 000000000000000001111111 | 7 |
| 000000000000000011111111 | 8 |
| 000000000000000111111111 | 9 |
| 000000000000001111111111 | 10 |
| 000000000000011111111111 | 11 |
| 000000000000111111111111 | 12 |
| 000000000001111111111111 | 13 |
| 000000000011111111111111 | 14 |
| 000000000111111111111111 | 15 |
| 000000001111111111111111 | 16 |
| 000000011111111111111111 | 17 |
| 000000111111111111111111 | 18 |
| 000001111111111111111111 | 19 |
| 000011111111111111111111 | 20 |
| 000111111111111111111111 | 21 |
| 001111111111111111111111 | 22 |
| 011111111111111111111111 | 23 |
| 111111111111111111111111 | 24 |

603

| FT_H<4:1> | FT_L<4:1> | CAP in |
|---|---|---|
| 0000 | 0000 | 0 |
| 0000 | 0001 | 1 |
| 0000 | 0011 | 2 |
| 0000 | 0111 | 3 |
| 0000 | 1111 | 4 |
| 0001 | 1111 | 5 |
| 0001 | 0111 | 6 |
| 0001 | 0011 | 7 |
| 0001 | 0001 | 8 |
| 0001 | 0000 | 9 |
| 0011 | 0000 | 10 |
| 0011 | 0001 | 11 |
| 0011 | 0011 | 12 |
| 0011 | 0111 | 13 |
| 0011 | 1111 | 14 |
| 0111 | 1111 | 15 |
| 0111 | 0111 | 16 |
| 0111 | 0011 | 17 |
| 0111 | 0001 | 18 |
| 0111 | 0000 | 19 |
| 1111 | 0000 | 20 |
| 1111 | 0001 | 21 |
| 1111 | 0011 | 22 |
| 1111 | 0111 | 23 |
| 1111 | 1111 | 24 |

MONOTONIC HYBRID CAPACITOR DIGITAL-TO-ANALOG CONVERTER

CROSS-REFERENCE TO RELATED APPLICATIONS

This application claims priority to U.S. Provisional Application No. 63/490,135, filed Mar. 14, 2023, entitled "Monotonic Hybrid CDAC With Only Single Control Bit Changes For Digitally Controlled Delay Line and Oscillators," which is incorporated herein by reference in its entirety.

BACKGROUND

Digital-to-analog converters are key components in clocking and communications applications that provide continuous analog output signals in response to discrete digital input signals. Some digital-to-analog converters rely on capacitors as primary elements to make this conversion. In a capacitor digital-to-analog converter (CDAC), capacitors accumulate and store charge based on a digital signal and an analog output signal is generated based on the charge across the capacitors of the CDAC.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

FIGS. 2A and 2B are circuit diagrams depicting logic units according to embodiments. FIG. 2C is a truth table showing input and output states of a logic unit according to an embodiment.

FIG. 6 shows a pair of tables depicting encoding schemes according to embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1A:
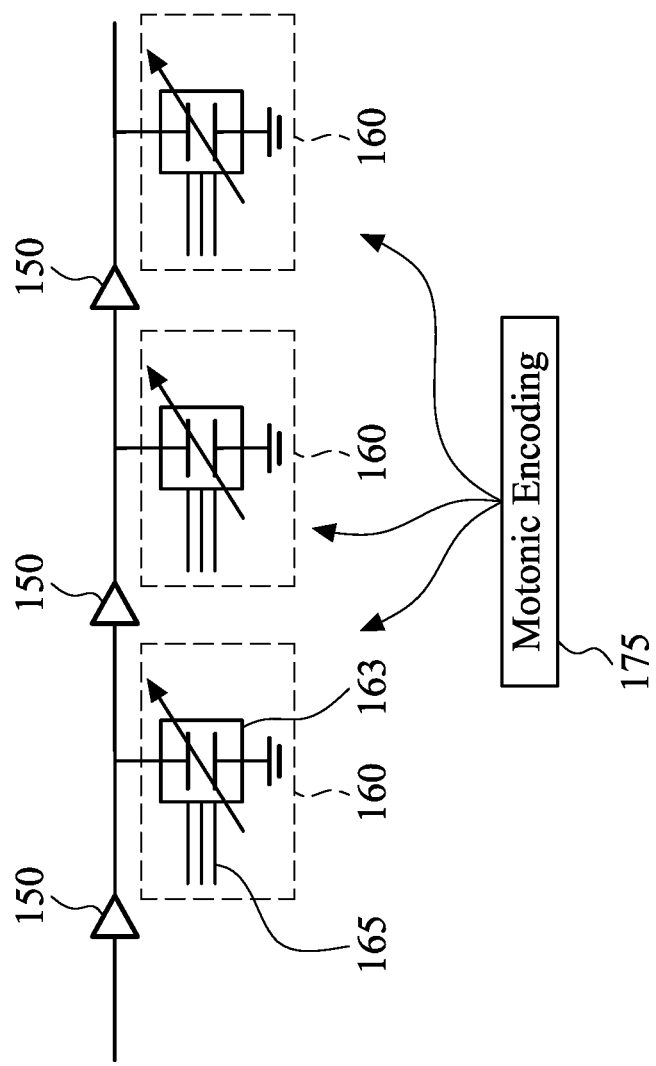
FIGS. 1A and 1B are circuit diagrams depicting a delay line incorporating a CDAC according to an embodiment and a CDAC array according to an embodiment.

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

In a variety of clocking and communications applications, CDAC elements may be used to convert an input digital signal into an output analog signal. The conversion process may rely on a digital encoding scheme that correlates the amount of charge across capacitors in a CDAC array with particular code values. Various encoding schemes have been proposed to represent the digital signal based on the charge on capacitors of a CDAC. Binary encoded CDACs can achieve a large number of codes from a small number of control lines, however, this encoding is not guaranteed to be monotonic (e.g., the output signal will not decrease when the input digital code increases) which can lead to glitching when multiple control inputs switch simultaneously. The term "monotonic" refers to a function having the property of either not increasing or not decreasing as the values of the independent variable increase. In CDACs, the output signal may depend on the input digital code such that a monotonic CDAC has an output signal that does not decrease when the input digital code increases.

To avoid this issue, some circuits, such as delay lines, may require CDACs therein to be monotonic. Thermometer encoded CDACs have been used in applications that require monotonicity, however, this encoding may require a large number of control lines, which takes up valuable design space and limits the resolution of a CDAC. Additionally, hybrid encoding schemes that combine thermometer with code with binary or other types of coding may suffer from dynamic glitching that occurs when multiple control inputs switch simultaneously.

Certain systems and methods herein may provide a monotonic (in some cases guaranteed monotonic) CDAC with a reduced number of control lines. Embodiments described herein may use a unique encoding scheme and area efficient logic to reduce the number of control lines required to achieve a given number of code combinations in a CDAC.

The encoding scheme may be implemented with a row/column layout arrangement to create an area efficient, monotonic digital-to-analog converter that may be used in a number of applications, including in digitally controlled high-frequency delay lines that are applicable for digitally controlled oscillators.

The encoding scheme of the present subject matter may provide monotonic CDACs having smaller area and fewer control lines. In embodiments described herein, one (in some instances only one) control output may switch at a time, unlike other hybrid schemes that can suffer from random mismatch that causes non-monotonic delay and frequency shifts. Monotonic tuning of the CDAC may be important for low jitter clock generation in components such as high-speed SerDes (Serializer/Deserializer) or die to die Input/Output (IOs).

FIG. 1A is a circuit diagram depicting a delay line incorporating capacitor digital-to-analog converters according to an embodiment. Delay lines may provide an important function in clock synchronization in circuits and communications. In an embodiment, a delay line may comprise a series of blocks comprising a buffer element 150 and a monotonic CDAC element 160. An input signal is routed through the delay in order to introduce a fixed lag time such that the output signal arrives in order within a circuit or system. CDAC elements 160 along the delay line may have an output signal corresponding to the charge across capacitors 163 of each element. This output signal may provide a modification that fine tunes and delays the signal propagating through the delay line. The output signal may be determined by a digital input along control lines 165. The CDAC element 160 may include area-efficient logic leading to a reduced number of control lines 165. The delay line may incorporate a monotonic encoding scheme 175 to ensure that the output signal is free from glitches that may cause errors in the delay.

Figure 1B:
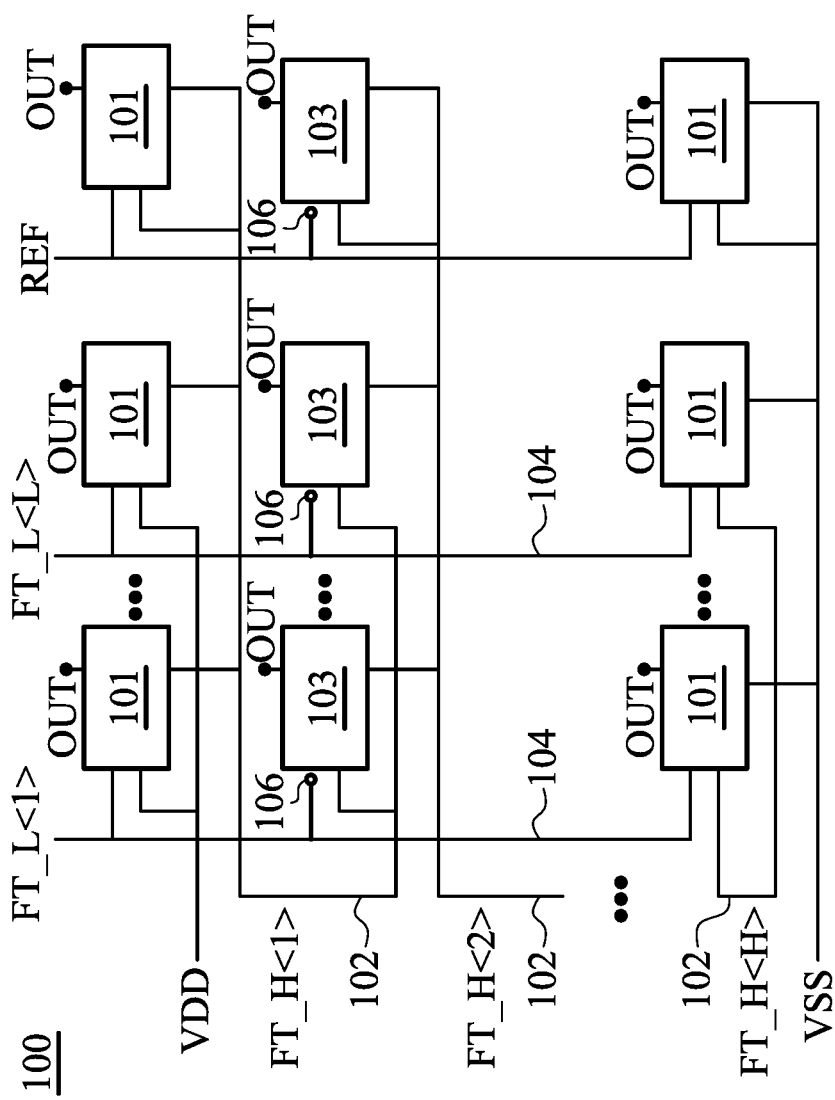

FIG. 1B is a circuit diagram depicting a CDAC array 100 according to an embodiment. The CDAC array depicted in FIG. 1B may be incorporated into a delay line like the one described above with respect to FIG. 1A in order to provide monotonic conversion with a reduced number of control lines. For convenience and symmetry, capacitors of a CDAC may be organized into unit cells and arranged across an array of rows and columns. These rows and columns may be accessed and controlled by a plurality of control lines including row control lines 102 and column control lines 104. Along with control lines, an array may comprise a number of reference voltage lines. For example, a first reference voltage line supplying a voltage VDD may be provided across a first row, a second reference voltage line supplying a voltage VSS may be provided across a last row, and a third reference voltage line supplying a voltage REF may be provided across a last column. As will be described in more detail below, the value of third reference voltage REF may not affect the operation of the CDAC array based on the implemented logic.

The array may further comprise a first plurality of unit cells 101. These cells may be provided across a first row. Unit cells 101 may include a capacitor connected to a corresponding logic unit and a switch. Each unit cell has a plurality of inputs connected to a control line or reference voltage. The switch within each unit cell may connect or disconnect the capacitor to an output based on signals passed from the logic unit. A code state CDAC is determined by the number of capacitors attached to the output. A second plurality of unit cells 103 may be provided in a second row. Unit cells 103 may comprise the same components as unit cell 101, however the input from a column signal line to a unit cell 103 may be inverted, as indicated by 106. The capacitors of each unit cell 101 and each unit cell 103 may all be of a same size.

In an embodiment, every other row of unit cells has an inverted first input where the unit cell connects to a column line. For an array having four rows, the second row and fourth row may have inverted inputs. The array may comprise any number of rows and any number of columns arranged in an M×N matrix. The pattern of inverted columns inputs may continue such that for M number of rows, each even row (2, 4, 6, 8, etc.) may have an inverted column input. Inverting the column inputs of every other row may allow for a gray coded, monotonic CDAC, as will be described further below. In the embodiment depicted in FIG. 1, the last row comprises unit cells 101 indicating that M is equal to an odd number.

The plurality of row control lines 102 may comprise H number of row control lines labeled from FT_H(1) through FT_H(H). The row control lines 102 may be arranged between first reference voltage line VDD that connects to unit cells 101 of the first row and second reference voltage line VSS that connects to unit cells 101 of the last row. Through this arrangement, the array may have one more total row than the number of row control lines 102. As such, for an M×N matrix having H control lines, M=H+1.

The plurality of column control lines 104 may comprise L number of column control lines labeled from FT_L(1) through FT_L(L). The column control lines may be arranged such that the first column connects to a first column control line FT_L(1). The last column connects to a third reference voltage line REF that extends parallel to the column control lines. The voltage of REF may be set to a level that maintains the state of first inputs for logic cells connected to the line. In an embodiment, REF may be set to VDD or to VSS. Through this arrangement the array may have one more total column than the number of column control lines 104. As such, for an M×N matrix having L control lines, N=L+1.

During operation, signals sent along the control line are routed through the logic unit of the unit cells to flip the switches of the unit cells thereby connecting and disconnecting capacitors to a common output. An encoding scheme may be generated based on which capacitors are connected to output, and this scheme may guarantee monotonic operation of a CDAC based on the arrangement of components and the logic used in the array.

Dividing the control lines of a thermometer encoded CDAC into row control lines FT_H and column control lines FT_L may limit the total number of control lines needed. The scheme may further use local decoding logic so as to provide a monotonic, gray coded system that only adds one unit capacitor per code change. By implementing this scheme, the necessary number of control lines may be reduced geometrically, according to equation 1 below.

$$\text{Number of lines needed in scheme} = 2 * (\sqrt{\text{lines needed in thermometer}} - 1) \quad \text{Equation 1}$$

For example, a 36 code CDAC using an encoding scheme according to embodiments described herein may require only 10 control lines ([2*(sqrt(36)-1)]=10). Similarly, a 64 code CDAC using an encoding scheme according to embodiments described herein may require only 14 control lines ([2*(sqrt(64)-1)]=14). For CDAC arrays arranged in rows and columns, the number of lines needed in a thermometer encoding scheme may be equal to the total number of capacitors in the array. For arrays using the encoding scheme described herein, the variable for lines needed in thermometer code may simplify to the number of total capacitors in the array.

FIGS. 2A and 2B are circuit diagrams depicting logic units according to embodiments. FIG. 2A shows a first logic unit according to a first embodiment. The logic unit may comprise a plurality of inputs 205, an output 225, an AND OR INVERTED (AOI) gate comprised of an AND gate 210 and a NOR gate 220 between the inputs and output. The NOR gate may comprise an OR gate with two inputs and an inverted output. The AND gate 205 may comprise a first input A and a second input B.

In an embodiment, the first input A may be a connected to a column signal line of a CDAC array, and the second input B may be connected to a row signal line of a CDAC array. The output of the AND gate 210 is connected to a first input of the NOR gate 220, and a third input C is connected as a second input of the NOR gate 220. Third input C may be connected to a row signal line of CDAC. Based on the states of inputs A, B, and C, the AOI output 225 is either on or off. In an embodiment, the AOI gate can be synthesized with eight transistors.

FIG. 2B shows a second logic unit according to a first embodiment. The logic unit may comprise a plurality of inputs 235, an output 275 and logic equivalent to an AOI gate comprised of a first NOT gate 240, a second NOT gate 250, a first NOR gate 260, and a second NOR gate 270. The first NOT gate 240 takes a first input A and outputs a signal to a first input of the first NOR gate 260. The second NOT gate 250 takes a second input B and outputs a signal to second input of the first NOR gate 260. The first NOR gate 260 takes these two inputs and has an output connected to a first input of the second NOR gate 270. A third input C is connected as a second input of the second NOR gate 270.

In an embodiment, the first input A may connect to a column signal line of a CDAC array, and the second input B may connect to a row signal line of the CDAC array. The third input C may connect to another row signal line of the CDAC array. Based on the states of inputs A, B, and C, the AOI output 275 is either on or off. In an embodiment, the AOI gate may be synthesized with twelve transistors. FIG. 2C is truth table 295 showing outputs for logic units as described above with reference to FIGS. 2A and 2B. As shown in the table, when input signal C is in an on state, the output of the gate will be in an off state, regardless of the states of input A and input B.

Figure 3:
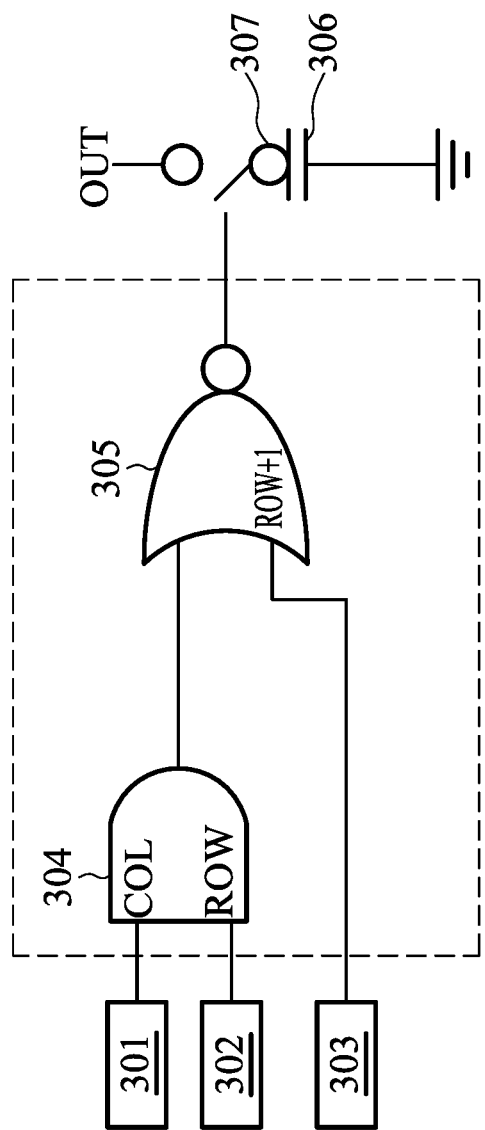
FIG. 3 is a circuit diagram depicting a unit cell according to an embodiment.

FIG. 3 is a circuit diagram depicting a unit cell of a CDAC array according to an embodiment. The unit cell may comprise a logic unit 310 similar to that described above with respect to FIG. 2A. The logic unit 310 may be an AOI gate comprising an AND gate 304 and a NOR gate 305. The AND gate may receive two inputs. A first input 301 may comprise a connection to a column signal line of a CDAC array, and a second input 302 may comprise a connection to a row signal line of the CDAC array. The output of the AND gate 304 may be connected to an input of NOR gate 305. A second input of NOR gate 305 may be connected to a third input 303. Third input 303 may also comprise a connection to a row signal line adjacent to the row signal line of 302. As will be described in more detail below, connecting the inputs in this manner may guarantee monotonicity of the CDAC array.

The output of NOR gate 305 may drive a switch 307 that toggles connection between a capacitor 306 and the common net output OUT. The capacitor may be any suitable capacitive structure such as a metal-insulator-metal capacitor or a capacitor employing transistor junction capacitance. The switch 307 may comprise any suitable gate-controlled switch element such as a single P-type metal-oxide-semiconductor field-effect transistor (PMOSFET), a single N-type metal-oxide-semiconductor field-effect transistor (NMOSFET) or a complimentary metal-oxide-semiconductor (CMOS) switch. In an embodiment, the switch element may have a same width as the capacitor and may operate with low leakage. To implement a CDAC array as described below, the switch 307 may be active low (i.e. switch is closed when its output is low) as may the case for a single PMOSFET switch element.

Figure 4:
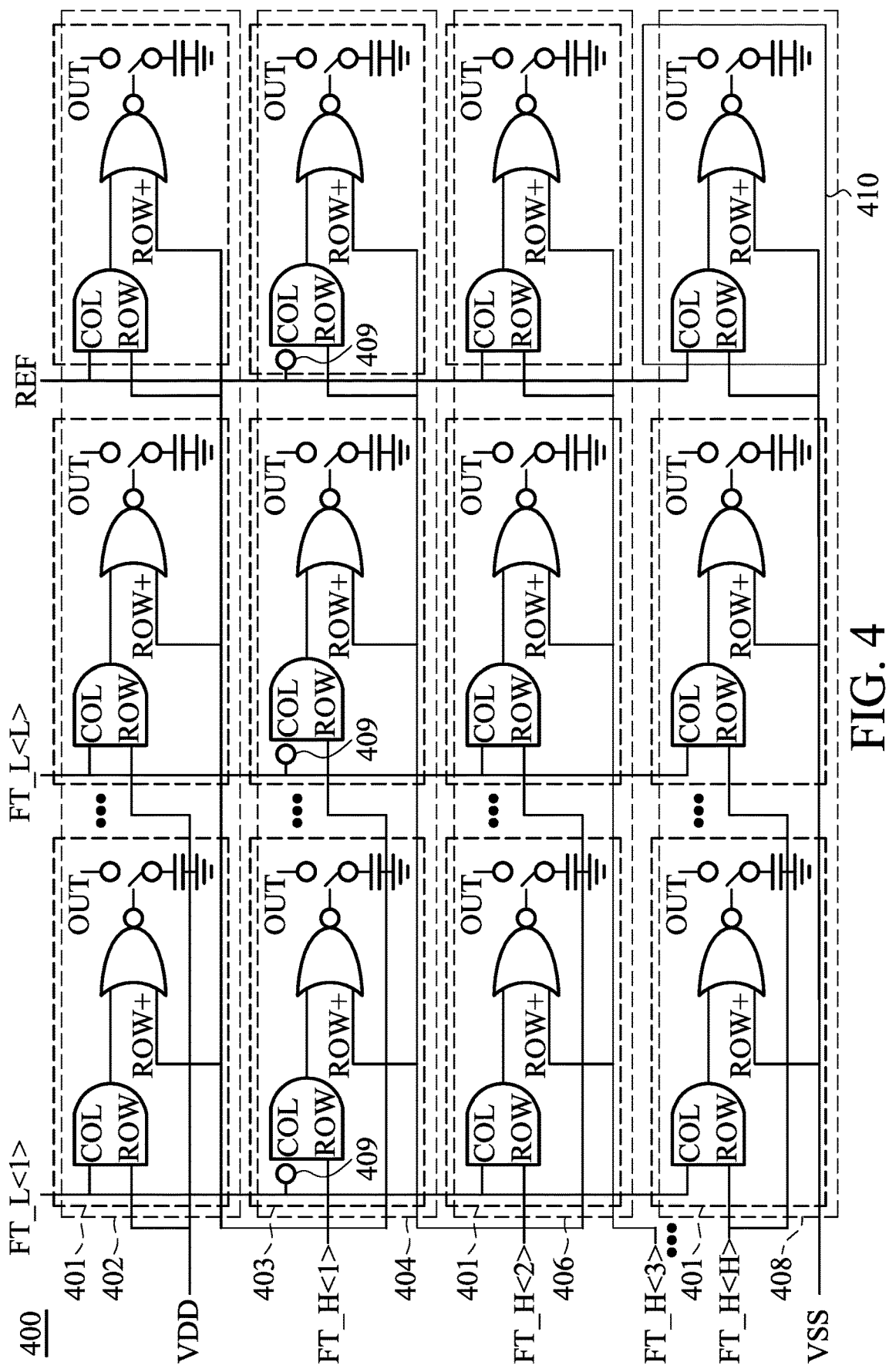
FIG. 4 is a circuit diagram depicting a CDAC array according to an embodiment.

FIG. 4 is a circuit diagram depicting a CDAC array 400 according to an embodiment. The CDAC array 400 may be similar to that described above with respect to FIG. 1, and may incorporate a unit cell as described above with respect to FIG. 3. In an embodiment, CDAC array 400 may comprise a plurality of logic units 401 in a first row 402, and every odd row thereafter, such as third row 406, and a plurality of logic units 403 in a second row 404, and every even row thereafter. In an embodiment, the array comprises an odd number of rows such that the last row 408 comprises logic cells 401 without inverted column inputs.

The logic units may be arranged in an M×N matrix. Column signal lines may connect to logic units of a particular column, and row signal lines may connect to logic units of a particular row. The row signal lines may comprise a first reference voltage line connected to logic units of the first row, a second reference voltage line connected to logic units of a last row, and H number of row control lines FT_H therebetween, wherein M=H+1. The column signal lines may comprise a third reference voltage line connected to a last column and L number of column control lines FT_L, wherein N=L+1.

In an embodiment, each row control line may span adjacent rows. For example, first row control line FT_H(1) may connect to logic units in the first row 402, as well as to logic units in the second row 404. Similarly, second row control line FT_H(2) may connect to logic units in the second row 404, as well as to logic units in the third row 406. The row control lines may connect to all logic units of the first row in which they are connected, and may connect to all logic units other than a logic unit of a lost column in the second row in which they are connected. For example, FT_H(1) connects to all logic elements in the first row 402, but in the second row 404, FT_H(1) is disconnected from the logic unit in the last column. Herein, row control lines may be said to correspond to the row in which they are disconnected from the logic unit in the last column. For example, in the embodiment described above FT_H(1) may correspond to second row 404.

Each logic unit may comprise an AOI gate as described above with respect to FIG. 3. The AOI gate may provide an area efficient solution for the encoding scheme that may be the same width as the switch of the logic unit. Each logic unit, for both logic units 401 and logic units 403, may comprise three inputs. The first input and the second input may make up the AND inputs of each AOI gate, while the third input may make up an input to the NOR gate of each AOI gate.

The AND gate of each logic unit may be driven by a column signal line connected as the first input and a row signal line connected as the second input. The NOR gate of each logic unit may be driven by the output of the AND gate, and by a row signal line connected as the third input. For logic gates other than those in the first row, last row, and last column, the AND gates may be driven by a corresponding column control line as the first input, and a corresponding row control line. For example, a logic unit 403 located in third row 406 and second to last column L may include an AND gate with a first input connected to column control line FT_L(L) and a second input connected to first row control line FT_H(2). Because this logic unit is in an even row, the column input 409 may be inverted in order to achieve a desired encoding scheme. The NOR gate of this logic unit receives a third input from the next row control line FT_H(3). The signals received at each input are run through the logic gates resulting in an output that determines whether nor not the capacitor of this logic unit connects to the common net output.

In the first row 402, the AND gates of logic units other than the logic unit of a last column may have a second input connected to the first reference voltage line VDD. The third input of each logic unit in the first row 402 may be connected to the first row control line FT_H(1). This may provide a first row control line FT_H(1) that is connected to second inputs of all logic units 403 in a corresponding row (as described above FT_H(1) corresponds to second row 404) other than a logic unit in the last column, from which it is disconnected. The first row control line FT_H(1) may further be connected third inputs of each logic unit in an adjacent row of the array, here first row 402. This connection pattern, including inverting the column input of each row, and having the capacitor of the logic unit in the last column of each row enabled by the next row control line, may provide an encoding scheme that guarantees monotonicity. In the last row 408, the AND gates of logic units other than the logic unit of a last column may have a second input connected to a last row control line FT_H(H). The third input of each logic unit in the last row 408 may then be connected to the second reference voltage line VSS.

In the last column, the first input of each AND gate is connected to the third reference voltage REF, and the second and third inputs are connected to the row control line corresponding to the subsequent row. In an embodiment, the third reference voltage REF is equivalent to the first reference voltage VDD. Capacitors in the last column are enabled by the next row select, and as such whether the column control line drives a 0 or a 1 value at input may not be of consequence to the overall logic of the array. The logic unit of unit cell 410 in the last column and last row may have second and third inputs connected to a same line, as is the case with all logic units of the last column, with this line being the second reference voltage line VSS, as is the case with all third inputs of the last row. The voltages and logic units may be provided such that the capacitor of unit cell 410 is never enabled.

For example, the switch of unit cell 410 may be active low as described above. VSS may be a ground voltage, and the logic unit of unit cell 410 may be an AOI gate as described above. With both the second and third inputs being connected to VSS, the AOI gate may output an on, or high, signal under normal operating conditions. Because the switch is active low, the high output signal may keep the switch in an off state, preventing the capacitor from being enabled.

Figure 5:
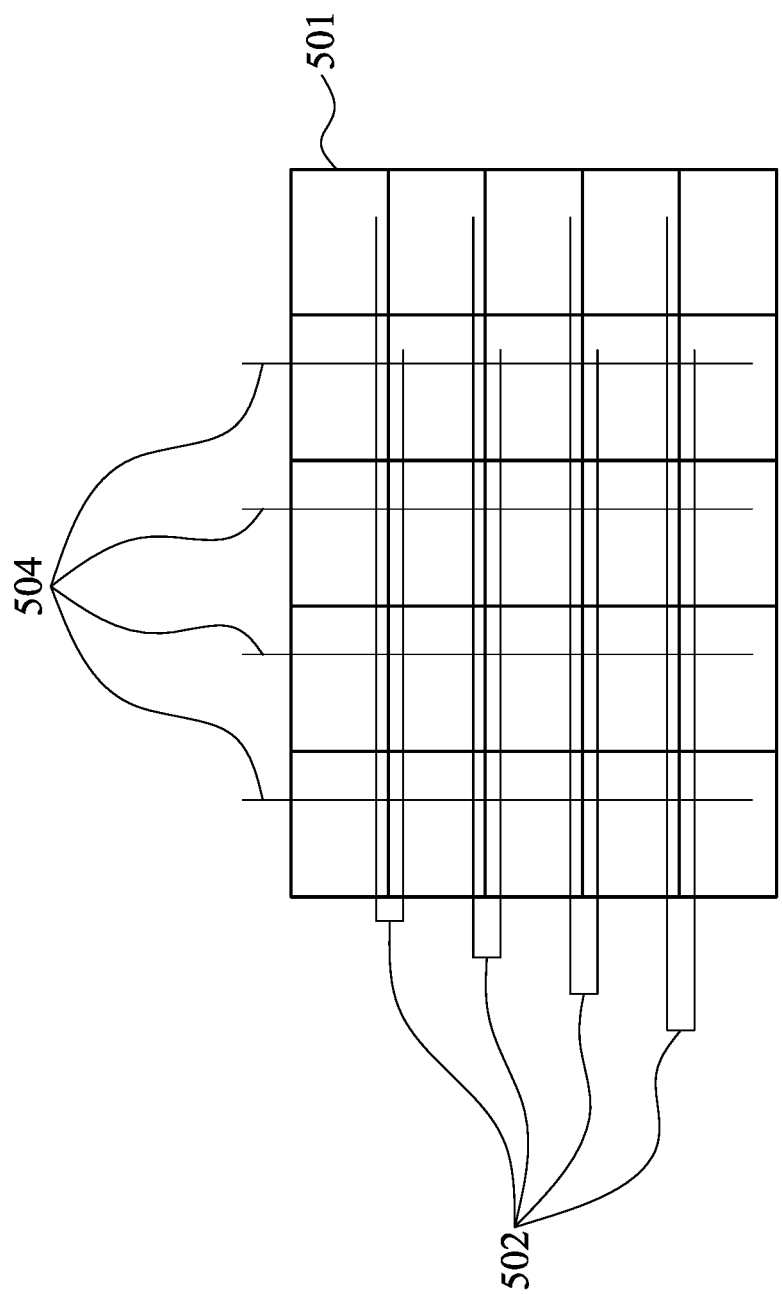
FIG. 5 is a diagram depicting a plan view of a CDAC array according to an embodiment.

FIG. 5 is a simplified diagram depicting a plan view of CDAC array 501 according to an embodiment. The array may comprise five rows and five columns making up a matrix having twenty-five total capacitors. Row control lines 502 may extend across rows, and column control lines 504 may extend along columns. As described in more detail above, each row control line may extend in two adjacent rows. For simplicity, FIG. 5 does not depict reference voltage lines and unit cells of the CDAC array 501. By implementing the control lines in this way and with the logic described above, the number of control lines needed for a given number of capacitors may be reduced. For example, here only eight total control lines may be needed to interconnect the array having twenty-five capacitors. As a result twenty-five codes may be obtained through only eight control lines, whereas a traditional thermometer encoded scheme may require at least twenty-four.

FIG. 6 shows a pair of tables depicting encoding schemes according to embodiments. The codes represented in tables 603 and 605 may represent a CDAC array similar to that described above with reference to FIG. 5, having four row control lines and four column control lines. Table 603 shows encoding for a traditional thermometer encoded CDAC. In this scheme, each capacitor is individually accessed to ensure monotonicity. This produces the codes scene in the table as an array progresses from a first code having zero capacitors attached through a twenty-fifth code having twenty-four capacitors attached.

In contrast, table 605 shows the encoding scheme of the present subject matter may achieve the same number of codes having only eight control lines. This scheme is still guaranteed to be monotonic as only one bit differs between each adjacent code, however, the arrangement of control lines and logic allows for monotonicity to be implemented with only eight control lines. The first column shows a state of each of the four row control lines, and the second column shows a state of each column control line.

Starting from a state with all capacitors disconnected and all control lines in an off state, capacitors are connected as states of the control lines change. For example, turning on a first column control line enables a first capacitor. Turning on a second column control line enables a second capacitor, and so on. In an embodiment, once all four column control lines are in an on state, with all row control lines in an off state, the capacitors of the first four columns in the first row will be connected. The first row control line, which is connected to the logic unit of the last column of the first row as described above, may then be switched to an on state in order to enable the capacitor in the last column. This pattern continues across rows and columns of the CDAC array in the manner shown in table 605, with only one line turning on or off at a time.

Figure 7:
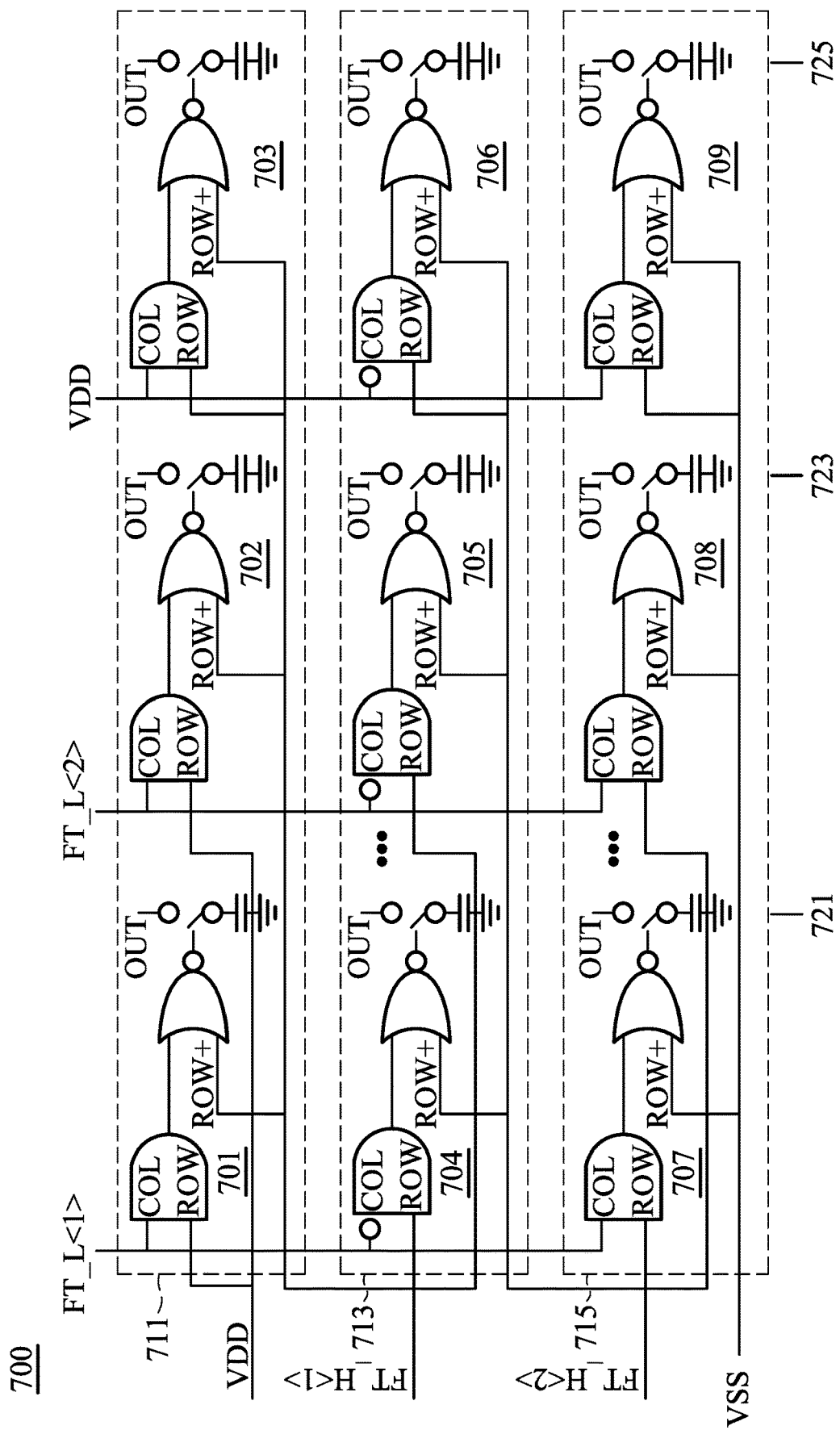
FIG. 7 is a circuit diagram depicting a CDAC array according to an embodiment.

FIG. 7 is a circuit diagram depicting a CDAC array 700 according to an embodiment. The array 700 may be a 3×3 array including nine total capacitors. Unit cells of the array may be arranged in a first row 711, a second row 713, and a third row 715. The unit cells are also arranged in a first column 721, a second column 723, and a third column 725. The array may comprise capacitors 701-709 that may be added monotonically in operation. In an embodiment, the column input for unit cells in the second row 713 may be inverted, a first reference voltage line may supply a voltage VDD to unit cells in the first row 711, a second reference voltage line VSS may supply a voltage VSS to unit cells in the last row 715, and a third reference voltage line may supply voltage VDD to unit cells in the last column. The encoding scheme of this array will be described in more detail below with respect to FIG. 8.

Figure 8:
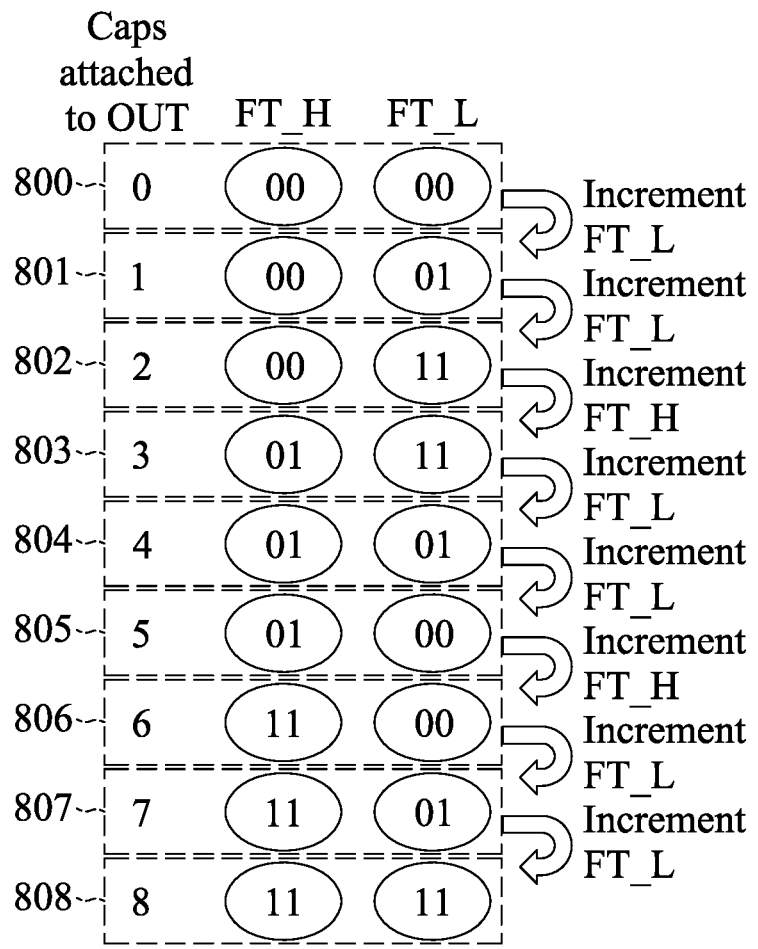
FIG. 8 is a flowchart depicting an encoding scheme according to an embodiment.

FIG. 8 is a flow diagram depicting an encoding scheme according to an embodiment. This diagram shows the manner in which capacitors are attached to the output net in order to achieve they hybrid encoding scheme for an array such as the one described above with respect to FIG. 7. In an embodiment, a first state 800 may be present with no capacitors attached to the output, and all control lines are off. To reach a second state 801 in which one capacitor is connected to the output, the column control lines FT_L may be incremented and a first column control line FT_L (1) may be turned on. This signal flips the switch connected to capacitor 701 and connects it to the output net. As such, one capacitor is added as a result of the change to one control line. To reach a third state 802 in which two capacitors are connected to the output, the column control lines FT_L may be incremented again, and a second column control line FT_L(2) may be turned on. This signal flips the switch connected to capacitor 702 and connects it to the output net.

In the array described above with respect to FIG. 7, the next capacitor in order is capacitor 703 which is situated in the last column 715. A fourth state 803 in which three capacitors are connected to the output may be reached by incrementing the row control lines FT_H and turning on a first row control line FT_H(1) that is connected to the logic unit associated with capacitor 703. This signal flips the switch connected to capacitor 703 and connects it to the output.

By inverting the column inputs of the second row, a fifth state 804 in which four capacitors are connected to the output may be reached by decrementing the column control lines and changing the signal along FT_L(2). This may flip switch associated with capacitor 704 and connect it to the output net, while maintaining the state of all other capacitors. To reach a sixth state 805 in which five capacitors are connected to the output, column control FT_L may be decremented and the signal changed along FT_L(1). This may flip the switch associated with capacitor 705 and connect 705 to the output. To reach a seventh state 806 in which six capacitors are connected to the output, the row control lines may be incremented again, in this state turning on second row control line FT_H(2) that is connected to the logic unit associated with capacitor 706. This signal may flip the switch associated with capacitor 706 and connect it to the output net.

To reach an eight state 807 in which seven capacitors are connected to the output, column control lines may be incremented, with the signal changing for first column control line FT_L(1). This may flip the switch associated with capacitor 707 and connect it to the output. An eight and final state 808 may be reached by incrementing the column control lines and changing the signal along FT_L(2), flipping the switch associated with capacitor 708 and connecting it to the output. In this encoding scheme, capacitor 709 may not be connected to the output.

This encoding scheme may allow for a nine code CDAC to be implemented with only four control lines. Additionally, because only one control line is changed per step while switching between adjacent codes, the encoding scheme is guaranteed to be monotonic. Changing only one control line per step may be important in some implementations of a CDAC such as a delay-locked loop (DLL) or a phase-locked look (PLL) where a digitally controlled delay, programmed via a CDAC, calls for monotonicity and low noise between steps.

Figure 9:
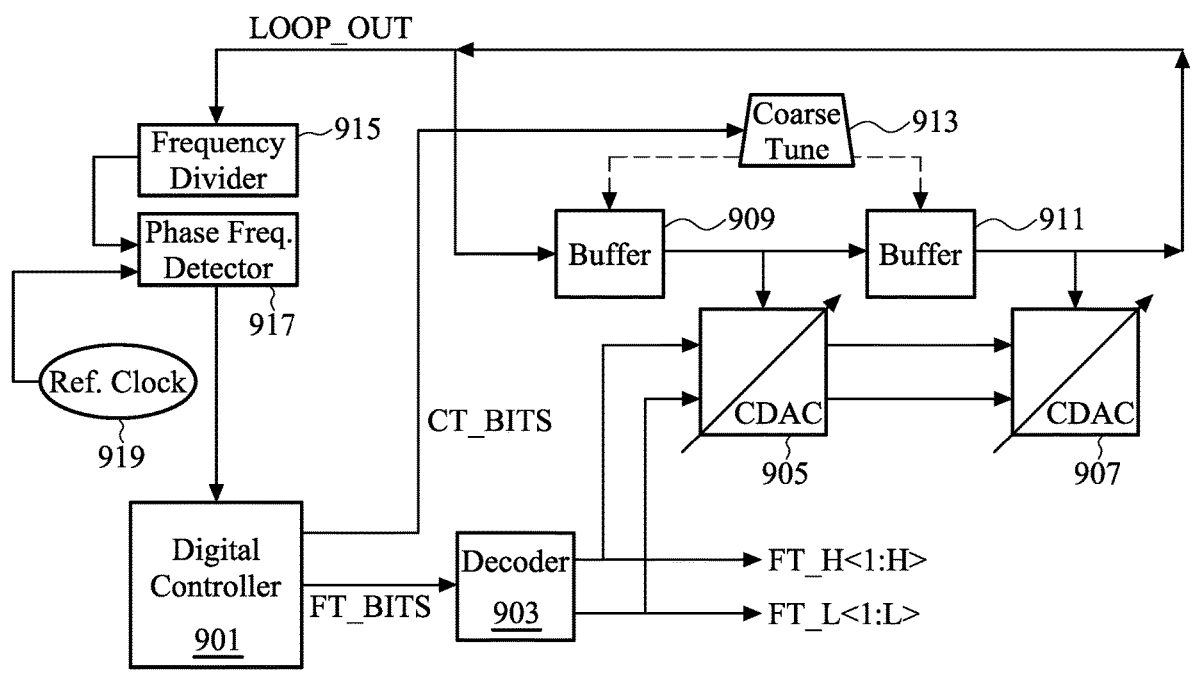
FIG. 9 is a block diagram depicting a digitally controlled phase locked loop according to an embodiment.

FIG. 9 is a block diagram depicting a digitally controlled phase-locked loop (DPLL) according to an embodiment. A DPLL may comprise a series connection of an arbitrary number of delay blocks, each delay block comprising a buffer 909/911 and a CDAC 905/907, where the last delay block connects to the first delay block to form a loop. In steady state operation, this connection may establish an oscillation at a particular frequency determined by the total delay of all of the elements. The value of the oscillating frequency can be adjusted through digital control of the buffer elements, as well as through digital control of the CDAC elements. In an embodiment, frequency adjustment may include a coarse tune adjustment (for large frequency steps) and a fine tune adjustment (for smaller frequency steps). The coarse tune adjustment may be accomplished by altering the buffer element digitally, and the fine tune adjustment may be enacted by changing a digital code controlling the CDAC elements.

In an embodiment a control loop comprising a frequency divider 915, a phase frequency detector 919 and a digital controller 901 may lock the frequency of the oscillator to a reference clock 921 (or some multiple frequency thereof). The digital controller 901 outputs bits for coarse tune and fine tune adjustment. Coarse tune bits are output to buffer elements where they are adjusted digitally in an operation indicated by 913. Fine tune bits may be decoded by a decoder 903 and passed along to the CDAC elements 905/907 as row bits FT_H(1:H) and column bits FT_L(1:L).

In an embodiment, digital controller 901 may receive a signal from the phase frequency detector 919 that indicates a difference between the loop output signal and the reference clock 921. Digital controller 901 may translate this signal into the coarse tune bits and fine tune bits for implementing frequency adjustment. The fine tune bits passed to decoder 903 may be in binary code or thermometer code, and the decoder may be used to convert this code into the hybrid encoding scheme described above. In an embodiment, the decoder 903 may comprise a computer implemented program or software including instructions for executing steps to translate the input code into the hybrid encoding scheme of the present invention. Such a decoding program may be executed by the digital controller 901.

Fine tuning of the frequency is accomplished by switching capacitors on and off to enact small changes in the delay. Using the CDAC and encoding scheme of the present subject matter may be advantageous for enacting these changes because only one control line is changed at a time, thereby reducing jitter of the output clock in a continuously running phase-locked loop. The CDAC elements 905 and 907 may comprise the CDAC arrays described above. The row bits FT_H(1:H) and column bits FT_L(1:L) passed from the decoder may correspond to a particular code of the encoding scheme and may connect capacitors to the net output that correspond to this code. The CDAC may then convert this into an analog signal used to adjust the delay loop.

Figure 10:
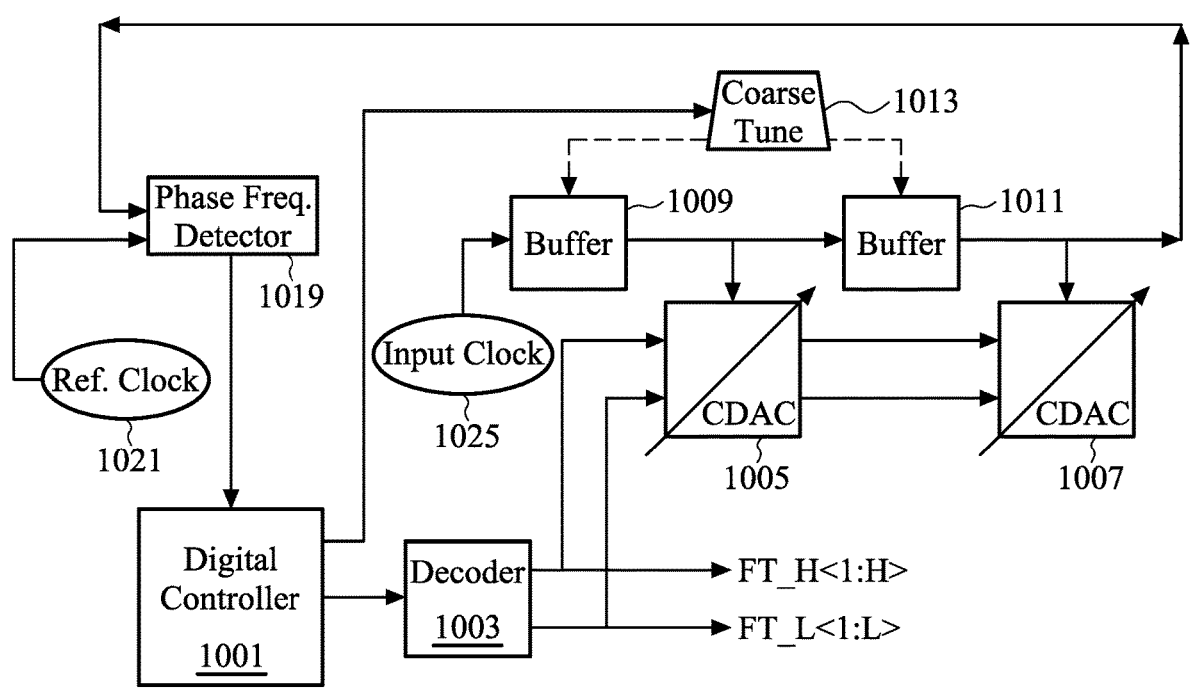
FIG. 10 is a block diagram depicting a digitally controlled delay locked loop according to an embodiment.

FIG. 10 is a block diagram depicting a digitally controlled delay-locked loop (DDLL) according to an embodiment. The DDLL is similar to the DPLL described above with respect to FIG. 9, except that the output of the loop is not connected to the input, and the feedback loop only controls the phase of the output signal. In an embodiment, a phase frequency detector 1019 detects a frequency of a signal output from the delay loop and compares this frequency to that of a reference clock 1021. The phase frequency detector 1019 may send a signal to the digital controller 1001 containing information regarding mismatch between the loop output and the reference clock 1021. The DDLL may then employ coarse tuning and fine tuning to shift the phase of the loop output to be in step with the reference clock 1021.

Coarse tune bits may be output from the digital controller 1001 to buffer elements 1009/1011 in order to implement larger frequency corrections. A first buffer element 1009 takes an input clock 1025 as input, rather than receiving the output of the loop as input as described above with respect to FIG. 9 and the DPLL. Frequency adjustments are made on the input clock 1025 and the output after frequency tuning is compared to reference clock 1021. Fine tune bits may be sent from the digital controller through a decoder 1003 that translates the bits into row bits and column bits. These row bits and column bits may be sent to CDAC elements 1005/1007 in order to implement smaller frequency corrections. Based on these frequency corrections, the output is fed back to the phase detector for another comparison.

Figure 11:
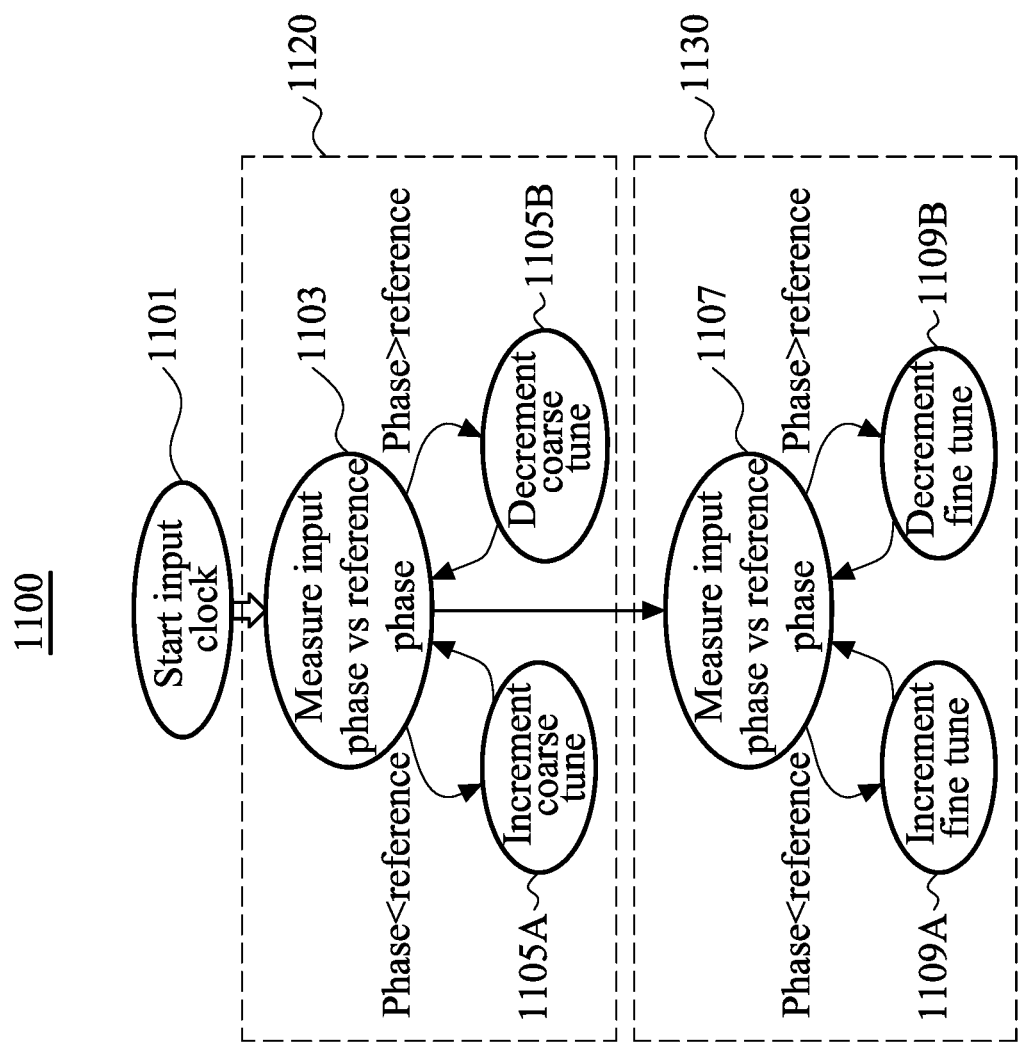
FIG. 11 is a flowchart depicting a method of operation according to an embodiment.

FIG. 11 is a flowchart depicting a method of operation according to an embodiment. The process flow depicted in FIG. 11 describes the frequency tuning operation of a delay line incorporating a CDAC. In an embodiment, the process of FIG. 11 may be implemented for a DDLL as described above with respect to FIG. 10. The flow may begin at 1101 with the start of an input clock. The signal from the input clock then enters a coarse tune stage 1120. In the coarse tune stage, the phase of the input clock is measured against a reference phase at 1103. If the input phase is less than a reference phase, a coarse tune increment may be applied at 1105A to increase the phase. If, however, the phase is greater than a reference phase, a coarse tune decrement may be applied at 1105B to decrease the phase. After implementing a coarse tune, the flow returns to 1103 to again compare the input phase against the reference phase. Coarse tuning may be implemented through digital control of the buffer elements in a DDLL or DPLL as described above. This process repeats until a steady state is achieved. The selection of a steady state may be based on an application specific algorithm designed to arrive at a preferred state.

Once a steady state is selected, the flow moves to a fine tune stage 1130. In the fine tune stage, smaller adjustments to the input phase may be implemented. The fine tune stage may begin at 1107 where the input phase is measured against the reference phase. If the input phase is less than the reference phase, a fine tune increment may be applied at 1109A to increase the phase. If the input phase is less than the reference phase a fine tune decrement may be applied at 1109B. After each fine tune, the flow returns to 1107 to again compare the input phase against the reference phase. Fine tuning may be implemented by controlling the CDAC elements of the circuit as described above. In the absence of a special algorithm, fine tuning of the phase may comprise alternating between two adjacent codes may comprise alternating between two adjacent codes at steady state, and changing between these codes as needed for any changes in operating conditions within the fine tune range. Monotonicity of the CDAC may be important in this implementation to ensure that mismatch does not occur when switching back and forth between adjacent codes.

Devices, and circuits are described herein. An example semiconductor device comprises a converter array comprising a plurality of capacitor digital-to-analog (CDAC) units, wherein each CDAC unit comprises a logic unit, a switch, and a capacitor, wherein each logic unit comprises a first input, a second input, and a third input. The device further includes a first set of control lines and a second set of control lines. Each of the first set of control lines is connected to the first inputs of the logic units of the CDAC units in a corresponding column of the converter array and a second set of control lines, and each of the second set of control lines is connected to the second inputs of the logic units of the CDAC units in a corresponding row of the converter array, and disconnected from the second input of the logic unit of a CDAC unit in the corresponding row and the last column of the converter array. Each of the second set of control lines is further connected to the third inputs of the logic units of the CDAC units in a row of the converter array adjacent to the corresponding row.

An example circuit comprise a frequency detector configured to receive a first signal and a reference signal as input and to output a second signal, a digital controller configured to receive the second signal from the frequency detector as input and to output a series of bits, and a delay loop configured to receive the series of bits as input and to output a loop output signal. The delay loop comprises a plurality of delay blocks, each delay block comprising a buffer element and a CDAC element, and each CDAC element comprises a converter array comprising a plurality of capacitor digital-to-analog (CDAC) units arranged in plurality of rows and a plurality of columns. Each CDAC unit further comprises a logic unit, a switch, and a capacitor, wherein each logic unit comprises a first input, a second input, and a third input. In each CDAC of the circuit, logic units arranged in adjacent rows have inverted first inputs.

In another example device, a CDAC comprises a plurality of unit cells, each unit cell comprising a logic unit, a switch, and a capacitor, and the plurality of unit cells are arranged in a matrix comprising M number of rows and N number of columns. The CDAC further comprises H number of row control lines, each row control line connected to unit cells in more than one row, and L number of column control lines, each column control line connected to unit cells in a single column. The values of M, N, H, and L are set to satisfy the equations: M=H+1, and N=L+1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the scope of the present disclosure.

What is claimed is:

1. A semiconductor apparatus comprising:
   a converter array comprising a plurality of capacitor digital-to-analog (CDAC) units, wherein each CDAC unit comprises a logic unit, a switch, and a capacitor, wherein each logic unit comprises a first input, a second input, and a third input;
   a first set of control lines, wherein each of the first set of control lines is connected to the first inputs of the logic units of the CDAC units in a corresponding column of the converter array;
   a second set of control lines, wherein each of the second set of control lines is connected to the second inputs of the logic units of the CDAC units in a corresponding row of the converter array, and disconnected from the second input of the logic unit of a CDAC unit in the corresponding row and the last column of the converter array, and wherein each of the second set of control lines is further connected to the third inputs of the logic units of the CDAC units in a row of the converter array adjacent to the corresponding row.

2. The semiconductor apparatus of claim 1, wherein signals of the first set of control lines are inverted for adjacent rows of the converter array.

3. The semiconductor apparatus of claim 1, wherein the logic unit of each CDAC unit comprises an AND OR INVERTED (AOI) gate.

4. The semiconductor apparatus of claim 3, wherein the AOI gate comprises an AND gate and a NOR gate.

5. The semiconductor apparatus of claim 4, wherein the first input comprises a first input of the AND gate;
the second input comprises a second input of the AND gate;
an output of the AND gate comprises a first input of the NOR gate; and
the third input comprises a second input of the NOR gate.

6. The semiconductor apparatus of claim 3, wherein the logic unit comprises eight transistors.

7. The semiconductor apparatus of claim 1, wherein the logic unit comprises two inverters and two NOR gates.

8. The semiconductor apparatus of claim 6, wherein the first input comprises an input to a first inverter;
the second input comprises an input to a second inverter;
an output of the first inverter comprises a first input of a first NOR gate;
an output of the second inverter comprises a second input of the first NOR gate;
an output of the first NOR gate comprises a first input of a second NOR gate; and
the third input comprises a second input of the second NOR gate.

9. The semiconductor apparatus of claim 1, further comprising:
a first reference voltage line connected to second inputs of logic units in a first row of the converter array other than a logic unit in the last column of the first row;
a second reference voltage line connected to third inputs of logic units in a last row of the converter array; and
a third reference voltage line connected to first inputs of logic units in a last column of the converter array.

10. The semiconductor apparatus of claim 1, wherein the converter array comprises Q number of capacitors; and
the array comprises P number of control lines; and
P and Q satisfy the equation $P=2*(\sqrt{Q}-1)$.

11. A circuit comprising:
a frequency detector configured to receive a first signal and a reference signal as inputs;
a digital controller in communication with the frequency detector; and
a delay loop connected to the digital controller and configured to output a loop output signal, the delay loop comprising a buffer element and a CDAC element;
wherein the CDAC element comprises a converter array comprising a plurality of capacitor digital-to-analog (CDAC) units arranged in plurality of rows and a plurality of columns, wherein each CDAC unit comprises a logic unit, a switch, and a capacitor, wherein each logic unit comprises a first input, a second input, and a third input;
logic units arranged in adjacent rows have inverted first inputs.

12. The circuit of claim 11, wherein the first signal comprises the loop output signal and the circuit comprises a delay-locked loop.

13. The circuit of claim 12, wherein the logic unit of each CDAC unit comprises an AOI gate comprising an AND gate and a NOR gate.

14. The circuit of claim 12, wherein the logic unit of each CDAC unit comprises two inverters and two NOR gates.

15. The circuit of claim 11, wherein the circuit comprises a phase-locked loop, further comprising a frequency divider configured to receive the loop output signal as input and to generate the first signal as output.

16. The circuit of claim 15, wherein the logic unit of each CDAC unit comprises an AOI gate comprising an AND gate and a NOR gate.

17. The circuit of claim 15, wherein the logic unit of each CDAC unit comprises two inverters and two NOR gates.

18. The circuit of claim 11, further comprising a decoder configured to receive the series of bits from the digital controller as input and to output a plurality of row bits and a plurality of column bits to CDAC elements of the delay loop.

19. A capacitor digital-to-analog converter (CDAC) comprising:
a plurality of unit cells each comprising a capacitor, wherein the plurality of unit cells are arranged in a matrix comprising M number of rows and N number of columns;
H number of row control lines, each row control line connected to unit cells in more than one row; and
L number of column control lines, each column control line connected to unit cells in a single column,
wherein M, N, H, and L satisfy the equations:

$$M = H + 1; \text{ and}$$
$$N = L + 1.$$

20. A semiconductor device comprising:
a digital controller;
a plurality of buffer elements configured to receive signals from the digital controller; and
a plurality of CDAC elements, each CDAC element connected to a buffer element of the plurality of buffer elements,
wherein each CDAC element comprises a CDAC according to claim 19.

* * * * *